(12) United States Patent
Hu et al.

(10) Patent No.: US 12,218,188 B2
(45) Date of Patent: *Feb. 4, 2025

(54) DEEP TRENCH INTERSECTIONS

(71) Applicant: Texas Instruments Incorporated, Dallas, TX (US)

(72) Inventors: Binghua Hu, Plano, TX (US); Ye Shao, Plano, TX (US); John K Arch, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/380,060

(22) Filed: Jul. 20, 2021

(65) Prior Publication Data

US 2021/0351269 A1   Nov. 11, 2021

Related U.S. Application Data

(63) Continuation of application No. 16/786,555, filed on Feb. 10, 2020, now Pat. No. 11,101,342.

(51) Int. Cl.
*H01L 29/06* (2006.01)
*H01L 21/308* (2006.01)
*H01L 21/3105* (2006.01)
*H01L 21/3205* (2006.01)
*H01L 21/321* (2006.01)
*H01L 21/762* (2006.01)
(Continued)

(52) U.S. Cl.
CPC ........ *H01L 29/0603* (2013.01); *H01L 21/308* (2013.01); *H01L 21/31053* (2013.01); *H01L 21/32055* (2013.01); *H01L 21/3212* (2013.01); *H01L 21/76232* (2013.01); *H01L 29/407* (2013.01); *H01L 29/4236* (2013.01)

(58) Field of Classification Search
None
See application file for complete search history.

(56) References Cited

U.S. PATENT DOCUMENTS 5,683,075 A * 11/1997 Gaul ................. H01L 21/76232
                                              257/E21.549
11,101,342 B1 * 8/2021 Hu ..................... H01L 21/32055
(Continued)

OTHER PUBLICATIONS

Lerner et al., WO 2007065946A1, Isolation Trench Structure for High Dielectric Strength, Jun. 14, 2007. (Year: 2007).*

*Primary Examiner* — Alexander G Ghyka
(74) *Attorney, Agent, or Firm* — Yudong Kim; Frank D. Cimino

(57) ABSTRACT

A semiconductor device has a deep trench in a semiconductor substrate of the semiconductor device, with linear trench segments extending to a trench intersection. Adjacent linear trench segments are connected by connector trench segments that surround a substrate pillar in the trench intersection. Each connector trench segment has a width at least as great as widths of the linear trench segments connected by the connector trench segment. The deep trench includes a trench filler material. The deep trench may have three linear trench segments extending to the trench intersection, connected by three connector trench segments, or may have four linear trench segments extending to the trench intersection, connected by four connector trench segments.

20 Claims, 7 Drawing Sheets

(51) Int. Cl.
   *H01L 29/40*    (2006.01)
   *H01L 29/423*   (2006.01)

(56) References Cited

U.S. PATENT DOCUMENTS

| | | |
|---|---|---|
| 2015/0303252 A1 | 10/2015 | Won et al. |
| 2017/0062611 A1 | 3/2017 | Zhang et al. |
| 2018/0166293 A1 | 6/2018 | Tsai et al. |
| 2019/0067301 A1 | 2/2019 | Yang et al. |
| 2019/0148219 A1 | 5/2019 | Yen et al. |
| 2020/0075735 A1 | 3/2020 | Yoshida |
| 2020/0083092 A1 | 3/2020 | Yen et al. |
| 2020/0243582 A1 | 7/2020 | Li et al. |

\* cited by examiner

__DEEP TRENCH INTERSECTIONS__

CROSS-REFERENCE TO RELATED APPLICATIONS

This application is a continuation of U.S. Nonprovisional patent application Ser. No. 16/786,555, filed Feb. 10, 2020, the content of which is herein incorporated by reference in its entirety.

FIELD

This disclosure relates to the field of semiconductor devices. More particularly, and not by way of any limitation, this disclosure relates to trench isolation in semiconductor devices.

BACKGROUND

Dielectric or conductive deep trenches are deployed in semiconductor devices and have multiple applications. In a semiconductor device, dielectric trenches may serve as isolation barriers between semiconductor devices. Conductive deep trenches segregate high voltage components from low voltage components. In a discrete component, conductive deep trenches may serve as field plates and gate electrodes for high power transistors. Dielectric or conductive deep trenches can intersect. At such intersections, the drawing geometry may have dramatic effect on the ability of the dielectric or conductive fill materials to efficiently fill the deep trench feature.

SUMMARY

The present disclosure introduces a semiconductor device having a first linear trench segment, a second linear trench segment perpendicular to the first linear trench segment, and a third linear trench segment perpendicular to the second linear trench segment, all in a substrate of the semiconductor device. The semiconductor device includes a trench intersection; the first linear trench segment, the second linear trench segment, and the third linear trench segment extend to the trench intersection. The trench intersection includes a first connector trench segment in the substrate that connects the first linear trench segment with the second linear trench segment. The trench intersection includes a second connector trench segment in the substrate that connects the second linear trench segment with the third linear trench segment. The trench intersection includes a third connector trench segment in the substrate that connects to the third linear trench segment.

The first connector trench segment, the second connector trench segment and the third connector trench segment each abut a substrate pillar located in the trench intersection. The substrate pillar is laterally surrounded by the trench intersection. The first linear trench segment has a first linear segment width, the second linear trench segment has a second linear segment width, and the third linear trench segment has a third linear segment width. The first connector trench segment has a first connector segment width that is at least as great as a minimum of the first linear segment width and the second linear segment width, and is no greater than a maximum of the first linear segment width and the second linear segment width. The second connector trench segment has a second connector segment width that is at least as great as a minimum of the second linear segment width and the third linear segment width, and is no greater than a maximum of the second linear segment width and the third linear segment width.

The semiconductor device may include a fourth linear trench segment extending to the trench intersection. The third connector trench segment connects the third linear trench segment to the fourth linear trench segment. The trench intersection includes a fourth trench connector segment that abuts the substrate pillar and connects the fourth linear trench segment to the first linear trench segment.

Like reference symbols in the various drawings indicate like elements. Details of one or more implementations of the present disclosure are set forth in the accompanying drawings and the descriptions below. The figures are not drawn to scale and they are provided merely to illustrate the disclosure. Specific details, relationships and methods are set forth to provide an understanding of the disclosure. Other features and advantages may be apparent from the description and drawings and from the claims.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Deep trench structures are found in many semiconductor devices such as high voltage analog semiconductor devices. In high voltage applications, a deep trench structure may include a conductive filler which can serve as a field plate for reducing electrical field density or as a gate electrode of a vertical transistor (e.g., a vertical diffused MOS (VDMOS transistor)). Deep trench structures can be formed with dielectric fill materials to provide isolation between electrical components.

In this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques or deposition techniques such as chemical vapor deposition (CVD), physical vapor deposition (PVD), PECVD, or atomic layer deposition (ALD), for example. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

It is noted that terms such as top, bottom, and under may be used in this disclosure. These terms should not be construed as limiting the position or orientation of a structure or element, but should be used to provide spatial relationship between structures or elements.

Figure 1A:
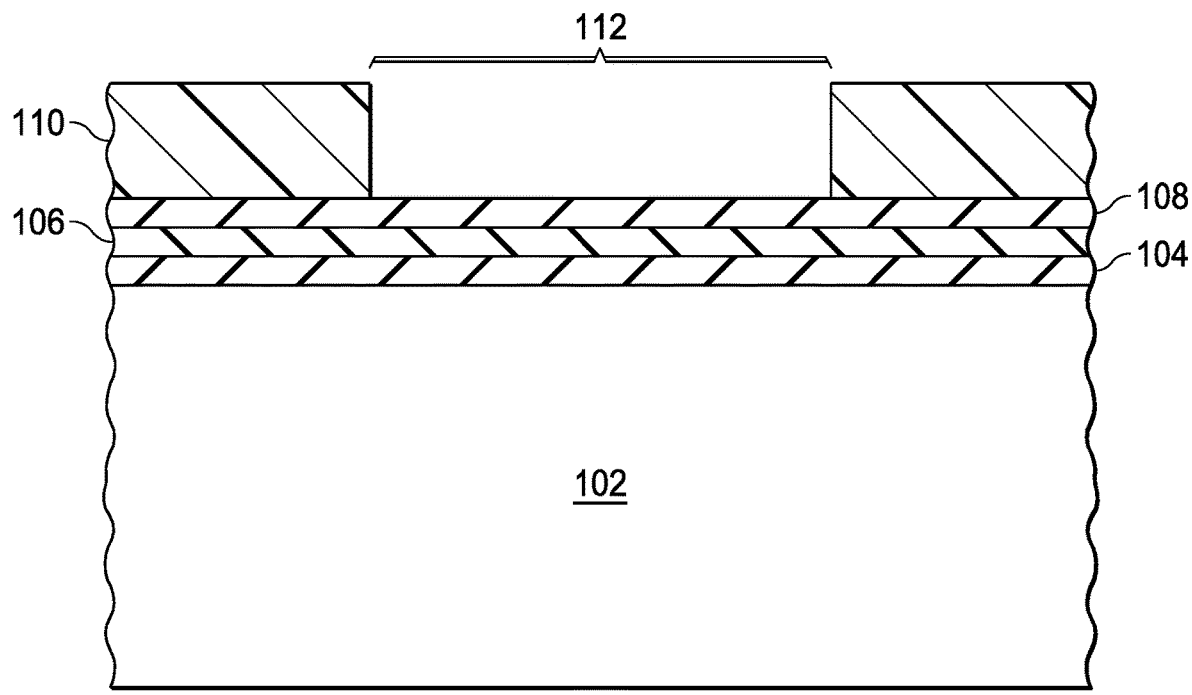
FIG. 1A through FIG. 1E show the partial cross-sectional views of a semiconductor device during a process for fabricating of a dielectric or conductive deep trench.

Shown in FIG. 1A through FIG. 1E, a semiconductor device 100 can be formed under a sequence that forms a deep trench structure. Referring to FIG. 1A, the semiconductor device 100 can be a discrete component device (e.g., A single transistor) or a semiconductor device having multiple devices. At an early state of the fabrication sequence, a pad oxide layer 104, a nitride cap layer 106 and a hard mask layer 108 may be sequentially formed on a top surface of a semiconductor substrate 102. The pad oxide layer 104 services the function of stress relief between the semiconductor substrate 102 and subsequent layers, and it may include silicon dioxide that is formed by a thermal oxidation process or a chemical vapor deposition process. The nitride cap layer 106 serves the function of exclusionary film allowing selective oxidation, and it may include silicon nitride (e.g., $Si_3N_4$ that is deposited under a low-pressure chemical vapor deposition (LPCVD) furnace process). The hard mask layer 108 serves the function of a hard mask during a subsequent deep trench etch process, and it may include a silicon dioxide that is deposited under a plasma enhanced chemical vapor deposition (PECVD) process.

Next, a photoresist mask 110 is deposited and patterned with an opening exposing a deep trench region 112 of the semiconductor substrate 102. The photoresist mask 110 serves the function of masking the hard mask layer 108 and it may include a light sensitive organic material that is coated, exposed and developed.

Figure 1B:
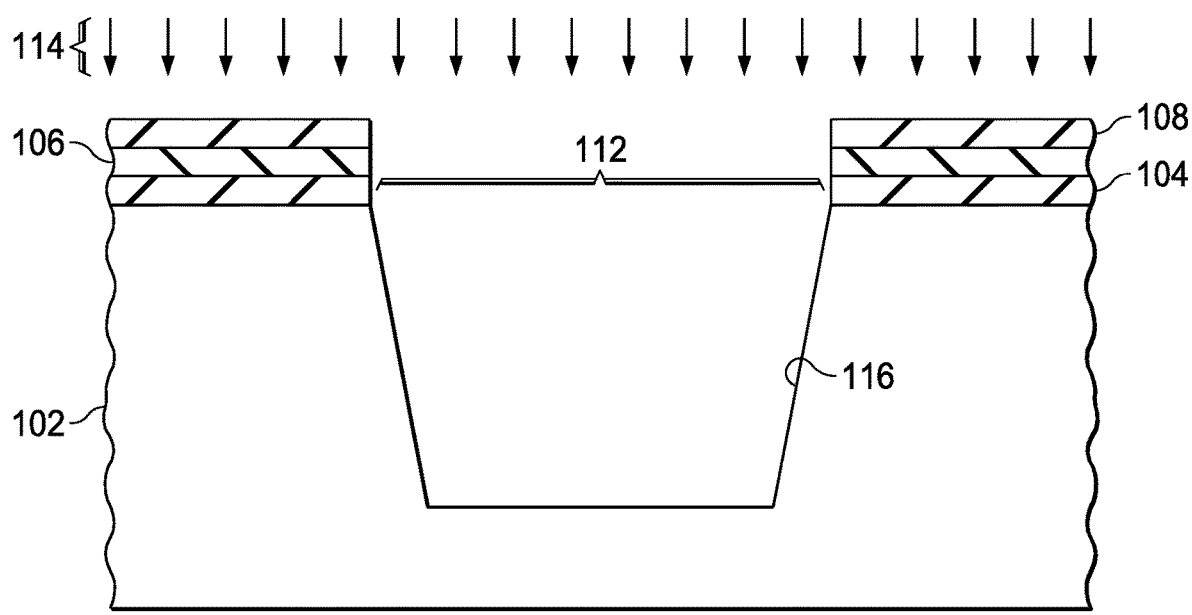

In FIG. 1B, a deep trench etch process 114 is performed to form a deep trench 116. The deep trench etch process 114 may include multiple sequences. In one implementation for example, a hard mask etch may be first performed to remove the hard mask layer 108 exposed by the patterned photoresist mask 110, and a silicon etch may then be performed to remove the nitride cap layer 106, the pad oxide layer 104, and the semiconductor substrate 102 that are exposed by the etched hard mask layer. During the silicon etch, the photoresist mask 110 is also removed, leaving the hard mask layer 108 to prevent the area outside of the deep trench region 112 from being etched.

Figure 1C:
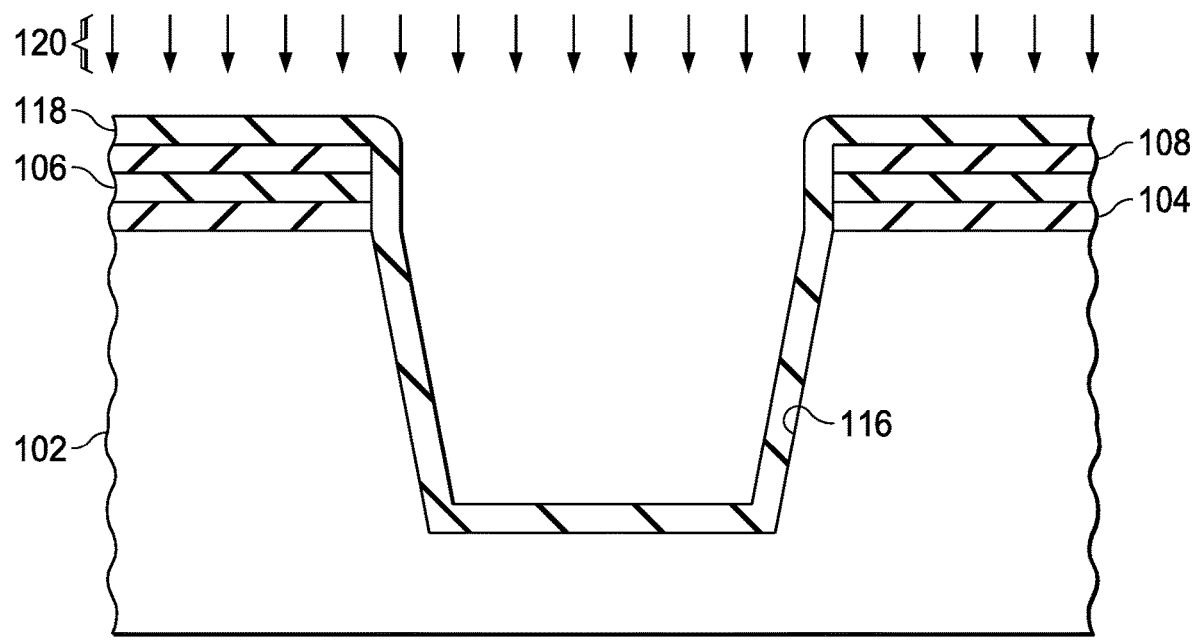

As shown in FIG. 1C, for example, a dielectric liner 118 may be deposited onto the surfaces of the semiconductor substrate 102 by a dielectric liner deposition process 120. In one implementation, the dielectric liner deposition process 120 may include a sub atmospheric chemical vapor deposition of an oxide target. The dielectric liner deposition process 120 may be followed by a trench dielectric etch process to achieve a uniform thickness of the dielectric liner 118 along the sidewall of the deep trench 116. In one version of this example, the dielectric liner 118 may include silicon dioxide formed by a thermal oxidation process.

Figure 1D:
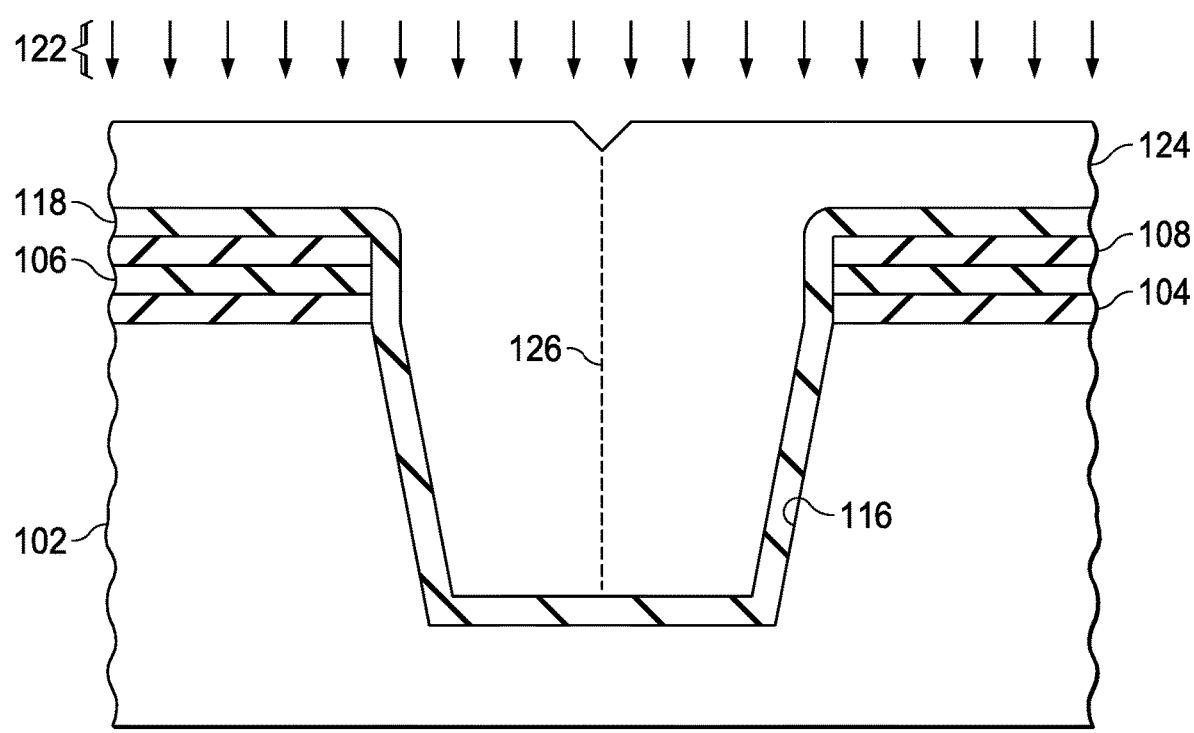

Referring to FIG. 1D, a trench fill deposition process 122 is performed to fill the deep trench 116 with a conductive or dielectric material. The trench fill deposition process 122 may be implemented as a dielectric deposition process 122 or a polycrystalline silicon, referred to herein as polysilicon, deposition process 122, by way of example.

As a result, a trench filler material 124 is formed in the deep trench 116, and extending over the top surface of a semiconductor substrate 102. The trench filler material 124 may contact the dielectric liner 118. Alternatively, the trench filler structure may directly contact the sidewall of the deep trench 116 in versions of this example in which the dielectric liner 118 is absent. During the trench fill deposition process 122, a trench filler seam 126 may form along the vertical middle section of the trench filler material 124. The dimensions of the trench filler seam 126 may depend on the aspect ratio of the deep trench 116.

Figure 1E:
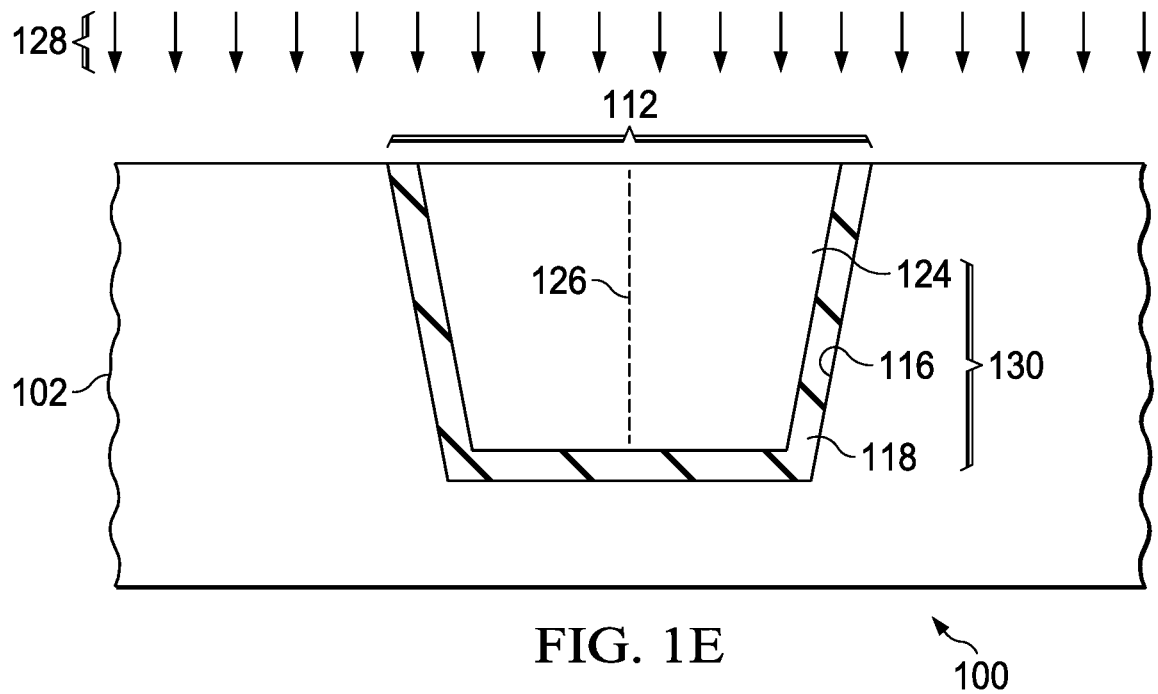

Referring to FIG. 1E, after the trench filler material 124 is formed, material of the trench filler material 124 outside of the deep trench 116 is removed by a planarization process 128, leaving the trench filler material 124 outside of the deep trench 116 to form a deep trench structure 130. The planarization process 128 may be implemented as a chemical mechanical polish (CMP) process 128 or an etch back process, by way of example.

Figure 2A:
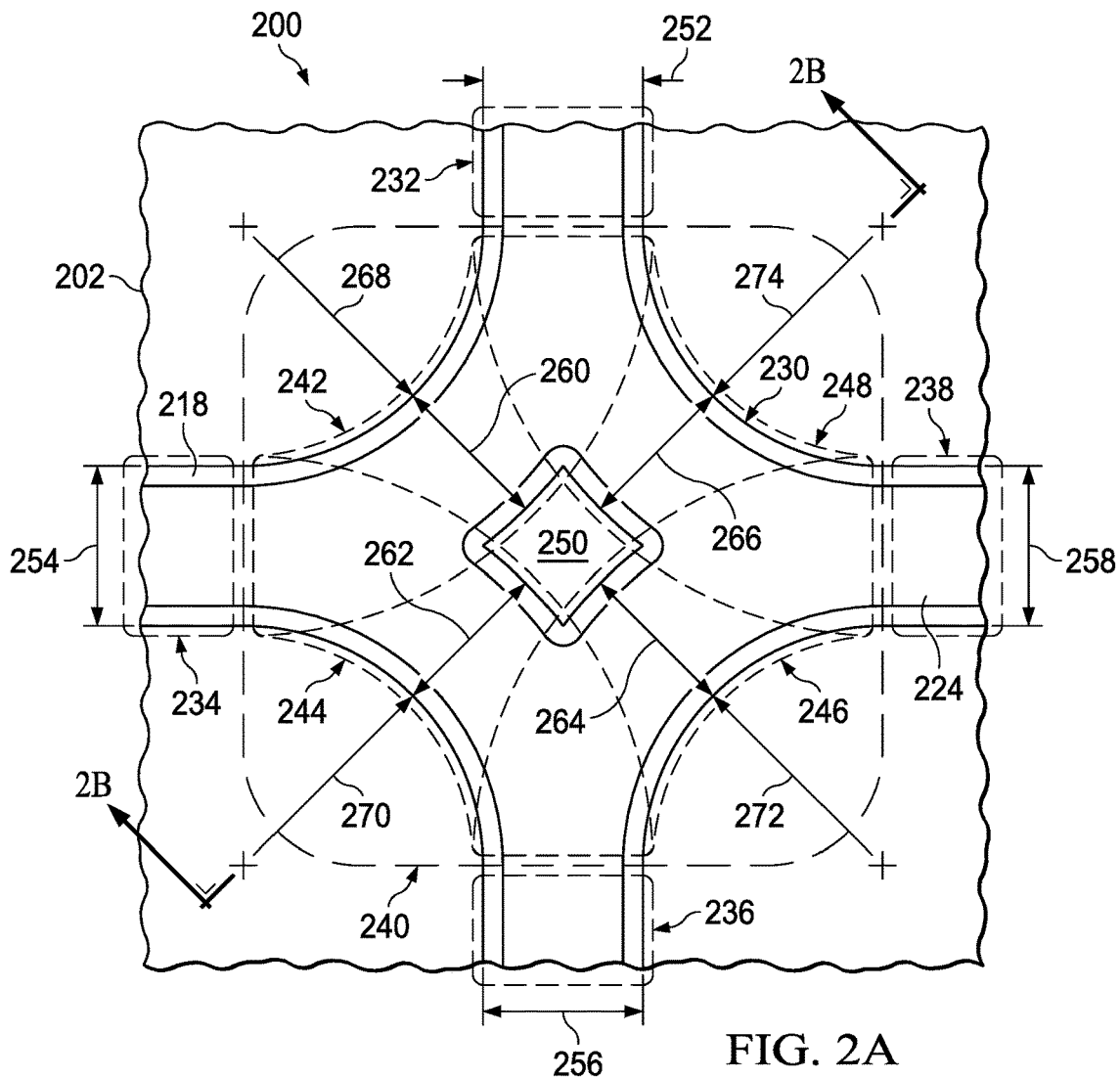
FIG. 2A and FIG. 2B are a top view and a cross section, respectively, of an example semiconductor device with four intersecting linear trench segments.
Figure 2B:
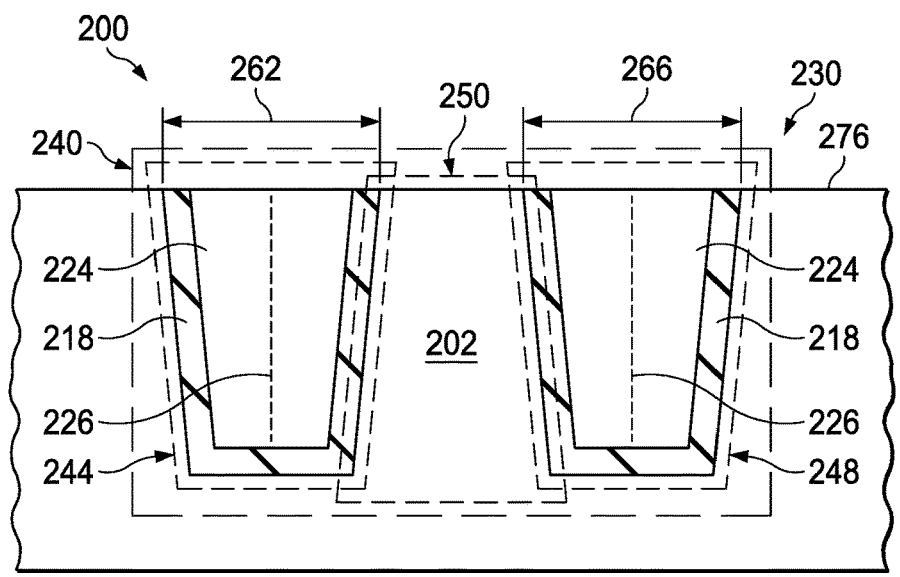

FIG. 2A and FIG. 2B are a top view and a cross section, respectively, of an example semiconductor device 200 with four intersecting linear trench segments. Referring to FIG. 2A, the semiconductor device 200 includes a semiconductor substrate 202. The semiconductor device 200 of this example includes a deep trench structure 230 having a first linear trench segment 232 in the semiconductor substrate 202, a second linear trench segment 234 in the semiconductor substrate 202, a third linear trench segment 236 in the semiconductor substrate 202, and a fourth linear trench segment 238 in the semiconductor substrate 202. The first linear trench segment 232, the second linear trench segment 234, the third linear trench segment 236, and the fourth linear trench segment 238 may be formed as disclosed in reference to FIG. 1A through FIG. 1E. The first linear trench segment 232, the second linear trench segment 234, the third linear trench segment 236, and the fourth linear trench segment 238 may include a dielectric liner 218 in contact with the semiconductor substrate 202, and a trench filler material 224 on the dielectric liner 218. The first linear trench segment 232 is perpendicular to the second linear trench segment 234 and the fourth linear trench segment 238, and is parallel to, and aligned with, the third linear trench segment 236. The second linear trench segment 234 is perpendicular to the third linear trench segment 236, and is parallel to, and aligned with, the fourth linear trench segment 238. The third linear trench segment 236 is perpendicular to the fourth linear trench segment 238. The terms "perpendicular" and "parallel" refer to orientations in the plane of FIG. 2A, and similarly for other examples disclosed herein.

The semiconductor device 200 includes a trench intersection 240 of the deep trench structure 230. The first linear trench segment 232, the second linear trench segment 234, the third linear trench segment 236, and the fourth linear trench segment 238 each extend to the trench intersection 240. The trench intersection 240 includes a first connector trench segment 242 of the deep trench structure 230 in the semiconductor substrate 202, connecting the first linear trench segment 232 to the second linear trench segment 234. The trench intersection 240 also includes a second connector trench segment 244 of the deep trench structure 230 in the semiconductor substrate 202, connecting the second linear trench segment 234 to the third linear trench segment 236. The trench intersection 240 of this example includes a third connector trench segment 246 of the deep trench structure 230 in the semiconductor substrate 202, connecting the third linear trench segment 236 to the fourth linear trench segment 238. The trench intersection 240 of this example further includes a fourth connector trench segment 248 of the deep trench structure 230 in the semiconductor substrate 202, connecting the fourth linear trench segment 238 to the first linear trench segment 232. It is noted that a portion of the trench intersection 240 may form part of both the first and second connector trench segments 242 and 244, both the second and third connector trench segments 244 and 246, both the third and fourth connector trench segments 246 and 248, or both the fourth and first connector trench segments 248 and 242. The first connector trench segment 242, the second connector trench segment 244, the third connector trench segment 246, and the fourth connector trench segment 248 are formed concurrently with the first linear trench segment 232, the second linear trench segment 234, the third linear trench segment 236, and the fourth linear trench segment 238, and include the dielectric liner 218 and the trench filler material 224.

A substrate pillar 250 is located in the trench intersection 240, and is laterally surrounded by the first connector trench segment 242, the second connector trench segment 244, the third connector trench segment 246, and the fourth connector trench segment 248. The terms "lateral" and "laterally" refer to directions in the plane of FIG. 2A.

The first linear trench segment 232 has a first linear segment width 252, the second linear trench segment 234 has a second linear segment width 254, the third linear trench segment 236 has a third linear segment width 256, and the fourth linear trench segment 238 has a fourth linear segment width 258. In this example, the first linear segment width 252, the second linear segment width 254, the third linear segment width 256, and the fourth linear segment width 258 may all be equal, and may be 0.5 microns to 3 microns, by way of example.

The first connector trench segment 242 has a first connector segment width 260, measured across the first connector trench segment 242 to the substrate pillar 250. The first connector segment width 260 is at least as great as a minimum of the first linear segment width 252 and the second linear segment width 254, and is no greater than a maximum of the first linear segment width 252 and the second linear segment width 254. In this example, in which the first linear segment width 252 and the second linear segment width 254 are equal, the first connector segment width 260 is thus equal to the first linear segment width 252 and equal to the second linear segment width 254.

The second connector trench segment 244 has a second connector segment width 262, measured across the second connector trench segment 244 to the substrate pillar 250. The second connector segment width 262 is at least as great as a minimum of the second linear segment width 254 and the third linear segment width 256, and is no greater than a maximum of the second linear segment width 254 and the third linear segment width 256. In this example, in which the second linear segment width 254 and the third linear segment width 256 are equal, the second connector segment width 262 is thus equal to the second linear segment width 254 and equal to the third linear segment width 256.

The third connector trench segment 246 has a third connector segment width 264, measured across the third connector trench segment 246 to the substrate pillar 250. The third connector segment width 264 of this example is at least as great as a minimum of the third linear segment width 256 and the fourth linear segment width 258, and is no greater than a maximum of the third linear segment width 256 and the fourth linear segment width 258. In this example, in which the third linear segment width 256 and the fourth linear segment width 258 are equal, the third connector segment width 264 is thus equal to the third linear segment width 256 and equal to the fourth linear segment width 258.

The fourth connector trench segment 248 has a fourth connector segment width 266, measured across the fourth connector trench segment 248 to the substrate pillar 250. The fourth connector segment width 266 of this example is at least as great as a minimum of the fourth linear segment width 258 and the first linear segment width 252, and is no greater than a maximum of the fourth linear segment width 258 and the first linear segment width 252. In this example, in which the fourth linear segment width 258 and the first linear segment width 252 are equal, the fourth connector segment width 266 is thus equal to the fourth linear segment width 258 and is equal to the first linear segment width 252.

Having the first connector segment width 260, the second connector segment width 262, the third connector segment width 264, and the fourth connector segment width 266 with the ranges disclosed herein may advantageously enable consistent formation of the trench filler material 224 without generating excess stress in the semiconductor substrate 202. The method of forming the linear trench segments 232, 234, 236, and 238 and the connector trench segments 242, 244, 246, and 248 may remove more of the semiconductor substrate in wider instances of the trench segments 232, 234, 236, 238, 242, 244, 246, and 248 than in narrower instances. Thus, having the connector segment widths 260, 262, 264, and 266 with the ranges disclosed herein may advantageously provide the connector trench segments 242, 244, 246, and 248 with depths that are at least as deep as any of the linear trench segments 232, 234, 236, and 238. This may be particularly advantageous when the connector trench segments 242, 244, 246, and 248 are parts of a deep trench isolation structure that connects to a buried layer in the semiconductor substrate 202.

The substrate pillar 250 may have an area equal to 30 percent to 120 percent of a square with a side equal to a minimum of the first linear segment width 252, the second linear segment width 254, the third linear segment width 256, and the fourth linear segment width 258. Having the area of the substrate pillar 250 at least 30 percent of the area of the square may facilitate a photolithographic process used to form an etch mask for the first connector trench segment 242, the second connector trench segment 244, the third connector trench segment 246, and the fourth connector trench segment 248, as an area less than 30 percent may be below a resolution limit of the photolithographic process and so fail to provide consistent values for the first connector segment width 260, the second connector segment width 262, the third connector segment width 264, and the fourth connector segment width 266. Having the area of the substrate pillar 250 no more than 120 percent of the area of the square may enable efficient use of area in the semiconductor device 200, thus advantageously reducing a fabrication cost of the semiconductor device 200 compared to a comparable device with a larger substrate pillar.

To attain the area of the substrate pillar 250 between 30 percent and 120 percent of the area of the square with the side equal to a minimum of the linear segment widths 252, 254, 256, and 258, the first connector trench segment 242 may follow an arced path with a first inner radius 268 that is 1.4 to 2.0 times the minimum of the first linear segment width 252 and the second linear segment width 254, the second connector trench segment 244 may follow an arced path with a second inner radius 270 that is 1.4 to 2.0 times the minimum of the second linear segment width 254 and the third linear segment width 256, the third connector trench segment 246 may follow an arced path with a third inner radius 272 that is 1.4 to 2.0 times the minimum of the third linear segment width 256 and the fourth linear segment width 258, and the fourth connector trench segment 248 may follow an arced path with a fourth inner radius 274 that is 1.4 to 2.0 times the minimum of the fourth linear segment width 258 and the first linear segment width 252.

Referring to FIG. 2B, the second connector trench segment 244 and the fourth connector trench segment 248 extend into the semiconductor substrate 202, abutting the substrate pillar 250. The substrate pillar 250 is a part of the semiconductor substrate 202. The semiconductor substrate 202 extends continuously under the trench intersection 240 and up into the substrate pillar 250. The substrate pillar 250 includes semiconductor material of the semiconductor substrate 202, which may advantageously reduce process complexity and fabrication cost compared to a similar semiconductor device having a pillar region filled with a separate material. The substrate pillar 250 extends to bottoms of the connector trench segments 242, 244, 246, and 248 and connects with the semiconductor material of the semiconductor substrate 202 under the trench intersection 240.

The second connector segment width 262 and the fourth connector segment width 266 are the widths of the second connector trench segment 244 and the fourth connector trench segment 248 at a top surface 276 of the semiconductor substrate 202. The dielectric liner 218 and the trench filler material 224 may extend to the top surface 276 of the semiconductor substrate 202. A trench filler seam 226 may extend along vertical middle sections of the trench filler material 224, for example, as disclosed in reference to FIG. 1D.

Figure 3:
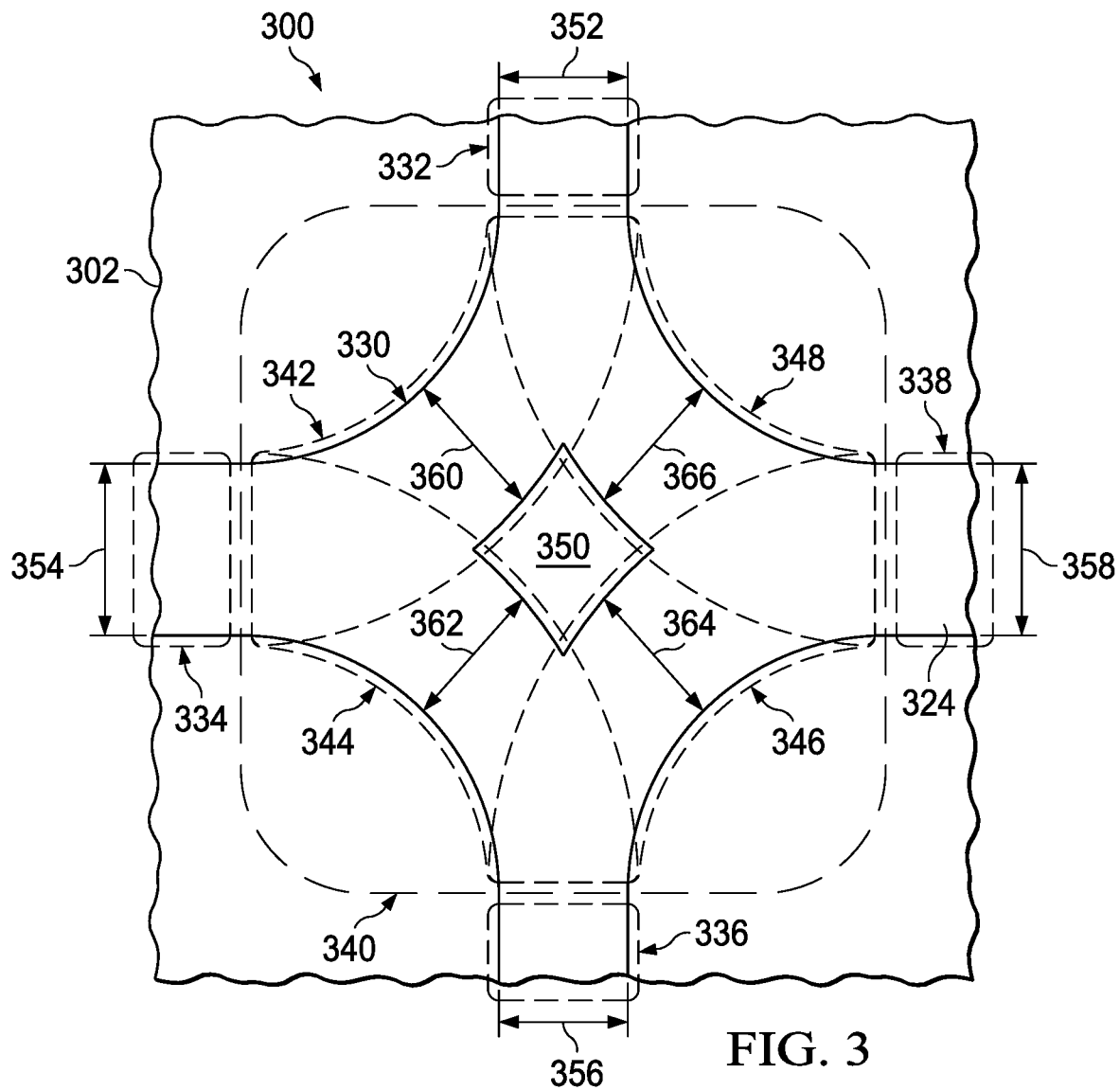
FIG. 3 is a top view of another example semiconductor device with four intersecting linear trench segments.

FIG. 3 is a top view of another example semiconductor device 300 with four intersecting linear trench segments. The semiconductor device 300 includes a semiconductor substrate 302. The semiconductor device 300 of this example includes a deep trench structure 330 having a first linear trench segment 332, a second linear trench segment 334, a third linear trench segment 336, and a fourth linear trench segment 338, all in the semiconductor substrate 302. The linear trench segments 332, 334, 336, and 338 include a trench filler material 324. The linear trench segments 332, 334, 336, and 338 may include a dielectric liner, not shown in FIG. 3, between the semiconductor substrate 302 and the trench filler material 324. The first linear trench segment 332 is perpendicular to the second linear trench segment 334 and the fourth linear trench segment 338, and is parallel to, and aligned with, the third linear trench segment 336. The second linear trench segment 334 is perpendicular to the third linear trench segment 336, and is parallel to, and aligned with, the fourth linear trench segment 338. The third linear trench segment 336 is perpendicular to the fourth linear trench segment 338.

The first linear trench segment 332 has a first linear segment width 352, the second linear trench segment 334 has a second linear segment width 354, the third linear trench segment 336 has a third linear segment width 356, and the fourth linear trench segment 338 has a fourth linear segment width 358. In this example, the first linear segment width 352 may be equal to the third linear segment width 356, and the second linear segment width 354 may be equal to the fourth linear segment width 358. In this example, the second linear segment width 354 and the fourth linear segment width 358 may be greater than the first linear segment width 352 and the third linear segment width 356, as depicted in FIG. 3.

The semiconductor device 300 includes a trench intersection 340 of the deep trench structure 330. The linear trench segments 332, 334, 336, and 338 each extend to the trench intersection 340. The trench intersection 340 includes a first connector trench segment 342 of the deep trench structure 330 in the semiconductor substrate 302, connecting the first linear trench segment 332 to the second linear trench segment 334. The trench intersection 340 also includes a second connector trench segment 344 of the deep trench structure 330 in the semiconductor substrate 302, connecting the second linear trench segment 334 to the third linear trench segment 336. The trench intersection 340 of this example includes a third connector trench segment 346 of the deep trench structure 330 in the semiconductor substrate 302, connecting the third linear trench segment 336 to the fourth linear trench segment 338. The trench intersection 340 of this example further includes a fourth connector trench segment 348 of the deep trench structure 330 in the semiconductor substrate 302, connecting the fourth linear trench segment 338 to the first linear trench segment 332. The connector trench segments 342, 344, 346, and 348 are formed concurrently with the linear trench segments 332, 334, 336, and 338. The connector trench segments 342, 344, 346, and 348 have structures and compositions similar to the linear trench segments 332, 334, 336, and 338, that is, the connector trench segments 342, 344, 346, and 348 include the trench filler material 324, and in versions of this example in which the linear trench segments 332, 334, 336, and 338 include the dielectric liner, the connector trench segments 342, 344, 346, and 348 also include the dielectric liner. A substrate pillar 350 is located in the trench intersection 340 and is laterally surrounded by the connector trench segments 342, 344, 346, and 348. The substrate pillar 350 includes semiconductor material of the semiconductor substrate 302. The substrate pillar 350 extends to bottoms of the connector trench segments 342, 344, 346, and 348 and connects with the semiconductor material of the semiconductor substrate 302 under the trench intersection 340, similarly to the substrate pillar 250 of FIG. 2B.

The first connector trench segment 342 has a first connector segment width 360, measured across the first connector trench segment 342 to the substrate pillar 350. The first connector segment width 360 is at least as great as a minimum of the first linear segment width 352 and the second linear segment width 354, and is no greater than a maximum of the first linear segment width 352 and the second linear segment width 354. Thus, in this example, the first connector segment width 360 is at least as great as the first linear segment width 352 and is no greater than the second linear segment width 354.

The second connector trench segment 344 has a second connector segment width 362, measured across the second connector trench segment 344 to the substrate pillar 350. The second connector segment width 362 is at least as great as a minimum of the second linear segment width 354 and the third linear segment width 356, and is no greater than a maximum of the second linear segment width 354 and the third linear segment width 356. Thus, in this example, the second connector segment width 362 is at least as great as the third linear segment width 356 and is no greater than the second linear segment width 354.

The third connector trench segment 346 has a third connector segment width 364, measured across the third connector trench segment 346 to the substrate pillar 350.

The third connector segment width 364 of this example is at least as great as a minimum of the third linear segment width 356 and the fourth linear segment width 358, and is no greater than a maximum of the third linear segment width 356 and the fourth linear segment width 358. Thus, in this example, the third connector segment width 364 is at least as great as the third linear segment width 356 and is no greater than the fourth linear segment width 358.

The fourth connector trench segment 348 has a fourth connector segment width 366, measured across the fourth connector trench segment 348 to the substrate pillar 350. The fourth connector segment width 366 of this example is at least as great as a minimum of the fourth linear segment width 358 and the first linear segment width 352, and is no greater than a maximum of the fourth linear segment width 358 and the first linear segment width 352. Thus, in this example, the fourth connector segment width 366 is at least as great as the first linear segment width 352 and is no greater than the fourth linear segment width 358.

Having the first connector segment width 360, the second connector segment width 362, the third connector segment width 364, and the fourth connector segment width 366 with the ranges disclosed herein may accrue the advantages disclosed in reference to FIG. 2A and FIG. 2B. The substrate pillar 350 may have an area equal to 30 percent to 120 percent of a square with a side equal to a minimum of the first linear segment width 352, the second linear segment width 354, the third linear segment width 356, and the fourth linear segment width 358, further accruing the advantages disclosed in reference to FIG. 2A and FIG. 2B. It is noted that a portion of the trench intersection 340 may form part of both the first and second connector trench segments 342 and 344, both the second and third connector trench segments 344 and 346, both the third and fourth connector trench segments 346 and 348, or both the fourth and first connector trench segments 348 and 342.

Figure 4B:
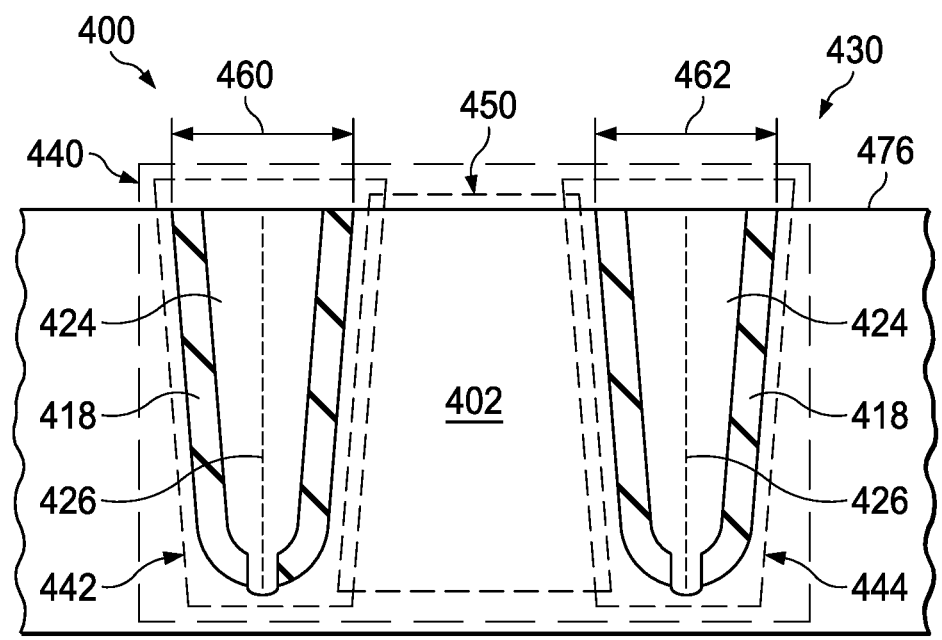
FIG. 4A and FIG. 4B are a top view and a cross section, respectively, of an example semiconductor device with three intersecting linear trench segments.
Figure 4A:
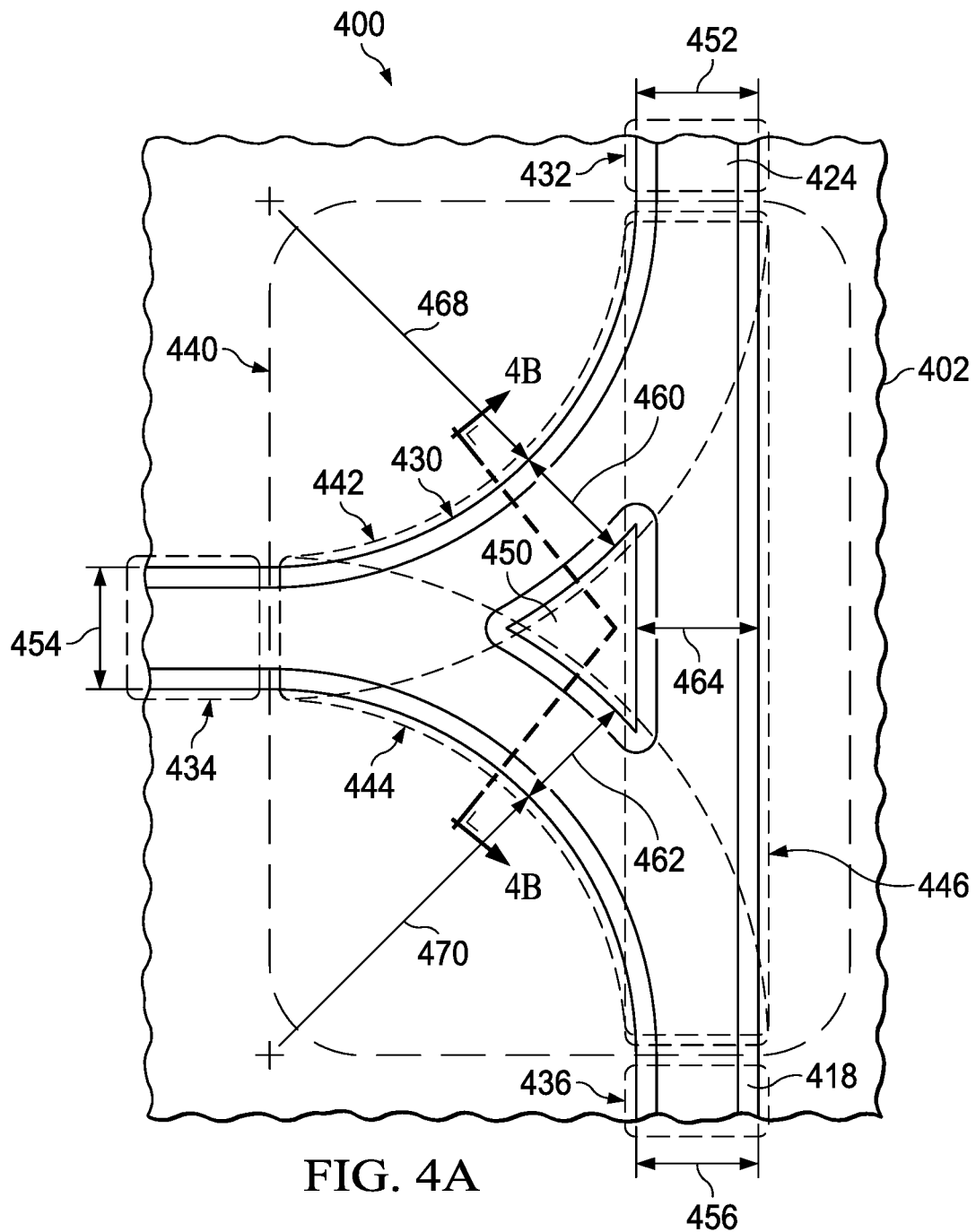

FIG. 4A and FIG. 4B are a top view and a cross section, respectively, of an example semiconductor device 400 with three intersecting linear trench segments. Referring to FIG. 4A, the semiconductor device 400 includes a semiconductor substrate 402, with a deep trench structure 430 having a first linear trench segment 432 in the semiconductor substrate 402, a second linear trench segment 434 in the semiconductor substrate 402, and a third linear trench segment 436 in the semiconductor substrate 402. The first linear trench segment 432, the second linear trench segment 434, and the third linear trench segment 436 may be formed as disclosed in reference to FIG. 1A through FIG. 1E. The first linear trench segment 432, the second linear trench segment 434, and the third linear trench segment 436 may include a dielectric liner 418 in contact with the semiconductor substrate 402, and a trench filler material 424 on the dielectric liner 418. The first linear trench segment 432 is perpendicular to the second linear trench segment 434, and is parallel to, and aligned with, the third linear trench segment 436. The second linear trench segment 434 is perpendicular to the first linear trench segment 432 and the third linear trench segment 436. The third linear trench segment 436 is parallel to, and aligned with, the first linear trench segment 432.

The semiconductor device 400 includes a trench intersection 440 of the deep trench structure 430. The first linear trench segment 432, the second linear trench segment 434, and the third linear trench segment 436 each extend to the trench intersection 440. The trench intersection 440 includes a first connector trench segment 442 of the deep trench structure 430 in the semiconductor substrate 402, connecting the first linear trench segment 432 to the second linear trench segment 434. The trench intersection 440 also includes a second connector trench segment 444 of the deep trench structure 430 in the semiconductor substrate 402, connecting the second linear trench segment 434 to the third linear trench segment 436. The trench intersection 440 of this example includes a third connector trench segment 446 of the deep trench structure 430 in the semiconductor substrate 402, connecting the third linear trench segment 436 to the first linear trench segment 432. The first connector trench segment 442, the second connector trench segment 444, and the third connector trench segment 446 are formed concurrently with the first linear trench segment 432, the second linear trench segment 434, and the third linear trench segment 436, and include the dielectric liner 418 and the trench filler material 424. It is noted that a portion of the trench intersection 440 may form part of both the first and second connector trench segments 442 and 444, both the second and third connector trench segments 444 and 446, or both the third and first connector trench segments 446 and 442.

The first linear trench segment 432 has a first linear segment width 452, the second linear trench segment 434 has a second linear segment width 454, and the third linear trench segment 436 has a third linear segment width 456. In this example, the first linear segment width 452, the second linear segment width 454, and the third linear segment width 456 may all be equal, and may be 0.5 microns to 3 microns, by way of example.

A substrate pillar 450 is located in the trench intersection 440 and is laterally surrounded by the first connector trench segment 442, the second connector trench segment 444, and the third connector trench segment 446. The first connector trench segment 442 has a first connector segment width 460, measured across the first connector trench segment 442 to the substrate pillar 450. The first connector segment width 460 is at least as great as a minimum of the first linear segment width 452 and the second linear segment width 454, and is no greater than a maximum of the first linear segment width 452 and the second linear segment width 454. In this example, in which the first linear segment width 452 and the second linear segment width 454 are equal, the first connector segment width 460 is thus equal to the first linear segment width 452 and equal to the second linear segment width 454.

The second connector trench segment 444 has a second connector segment width 462, measured across the second connector trench segment 444 to the substrate pillar 450. The second connector segment width 462 is at least as great as a minimum of the second linear segment width 454 and the third linear segment width 456, and is no greater than a maximum of the second linear segment width 454 and the third linear segment width 456. In this example, in which the second linear segment width 454 and the third linear segment width 456 are equal, the second connector segment width 462 is thus equal to the second linear segment width 454 and equal to the third linear segment width 456.

The third connector trench segment 446 has a third connector segment width 464, measured across the third connector trench segment 446 to the substrate pillar 450. The third connector segment width 464 of this example is at least as great as a minimum of the third linear segment width 456 and the first linear segment width 452, and is no greater than a maximum of the third linear segment width 456 and the first linear segment width 452. In this example, in which the third linear segment width 456 and the first linear segment width 452 are equal, the third connector segment width 464 is thus equal to the third linear segment width 456 and equal to the first linear segment width 452. Having the first connector segment width 460, the second connector segment width 462, and the third connector segment width 464 with the ranges disclosed herein may advantageously enable consistent formation of the trench filler material 424 without generating excess stress in the semiconductor substrate 402, and may accrue the advantages disclosed in reference to FIG. 2A and FIG. 2B.

The substrate pillar 450 may have an area equal to 30 percent to 120 percent of a square with a side equal to a minimum of the first linear segment width 452, the second linear segment width 454, and the third linear segment width 456. Having the area of the substrate pillar 450 from 30 percent to 120 percent of the area of the square may accrue the fabrication and area benefits disclosed in reference to FIG. 1. To attain the area of the substrate pillar 450 between 30 percent and 120 percent of the area of the square with the side equal to a minimum of the linear segment widths 452, 454, and 456, the first connector trench segment 442 may follow an arced path with a first inner radius 468 that is 2.4 to 3.2 times the minimum of the first linear segment width 452 and the second linear segment width 454. Similarly, the second connector trench segment 444 may follow an arced path with a second inner radius 470 that is 2.4 to 3.2 times the minimum of the second linear segment width 454. The third connector segment width 464 may have a straight configuration, as depicted in FIG. 4A.

Referring to FIG. 4B, the first connector trench segment 442 and the second connector trench segment 444 extend into the semiconductor substrate 402, abutting the substrate pillar 450. The substrate pillar 450 is a part of the semiconductor substrate 402, and extends to bottoms of the connector trench segments 442, 444, and 446, and connects with the semiconductor material of the semiconductor substrate 402, which extends continuously under the trench intersection 440. The substrate pillar 450 includes semiconductor material of the semiconductor substrate 402, accruing the advantage disclosed in reference to FIG. 2B. In this example, the dielectric liner 418 may be removed at bottoms of the deep trench structure 430, and the trench filler material 424 may contact the semiconductor material of the semiconductor substrate 402 at the bottoms, as depicted in FIG. 4B.

The first connector segment width 460 and the second connector segment width 462 are the widths of the first connector trench segment 442 and the second connector trench segment 444 at a top surface 476 of the semiconductor substrate 402. The dielectric liner 418 and the trench filler material 424 may extend to the top surface 476 of the semiconductor substrate 402. A trench filler seam 426 may extend along vertical middle sections of the trench filler material 424, for example, as disclosed in reference to FIG. 1D.

Figure 5:
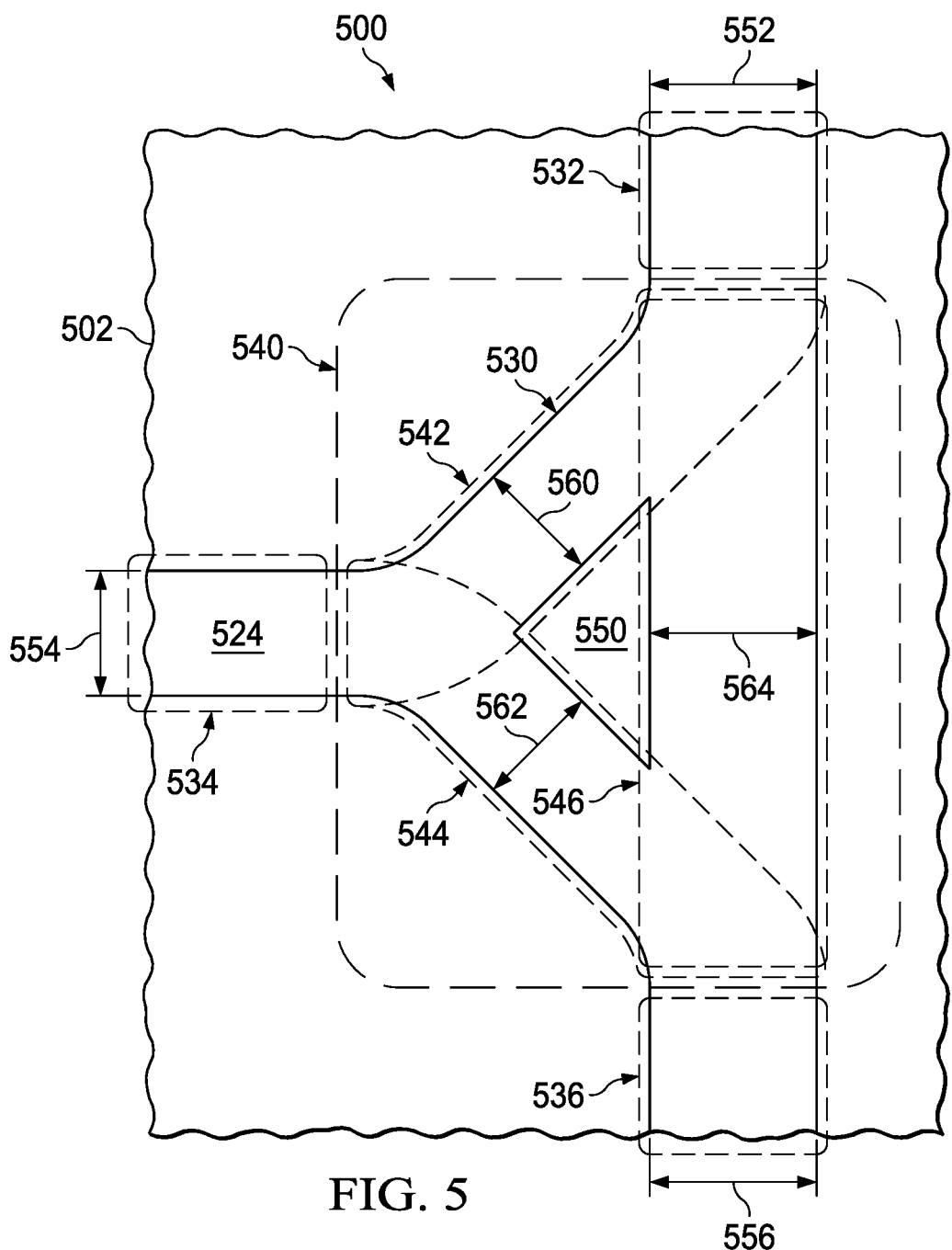
FIG. 5 is a top view of another example semiconductor device with three intersecting linear trench segments.

FIG. 5 is a top view of another example semiconductor device 500 with three intersecting linear trench segments in a semiconductor substrate 502. The semiconductor device 500 of this example includes a deep trench structure 530 having a first linear trench segment 532, a second linear trench segment 534, and a third linear trench segment 536, all in the semiconductor substrate 502. The linear trench segments 532, 534, and 536 include a trench filler material 524. The linear trench segments 532, 534, and 536 may include a dielectric liner, not shown in FIG. 5, between the semiconductor substrate 502 and the trench filler material 524. The first linear trench segment 532 is perpendicular to the second linear trench segment 534, and is parallel to, and aligned with, the third linear trench segment 536. The second linear trench segment 534 is perpendicular to the first linear trench segment 532 and to the third linear trench segment 536. The third linear trench segment 536 is parallel to, and aligned with, the first linear trench segment 532.

The first linear trench segment 532 has a first linear segment width 552, the second linear trench segment 534 has a second linear segment width 554, and the third linear trench segment 536 has a third linear segment width 556. In this example, the first linear segment width 552 may be equal to the third linear segment width 556, and greater than the second linear segment width 554, as depicted in FIG. 5.

The semiconductor device 500 includes a trench intersection 540 of the deep trench structure 530. The first linear trench segment 532, the second linear trench segment 534, and the third linear trench segment 536 each extend to the trench intersection 540. The trench intersection 540 includes a first connector trench segment 542 of the deep trench structure 530 in the semiconductor substrate 502, connecting the first linear trench segment 532 to the second linear trench segment 534. The trench intersection 540 also includes a second connector trench segment 544 of the deep trench structure 530 in the semiconductor substrate 502, connecting the second linear trench segment 534 to the third linear trench segment 536. The trench intersection 540 of this example includes a third connector trench segment 546 of the deep trench structure 530 in the semiconductor substrate 502, connecting the third linear trench segment 536 to the first linear trench segment 532. The connector trench segments 542, 544, and 546 are formed concurrently with the linear trench segments 532, 534, and 536. The connector trench segments 542, 544, and 546 have structures and compositions similar to the linear trench segments 532, 534, and 536, that is, the connector trench segments 542, 544, and 546 include the trench filler material 524, and in versions of this example in which the linear trench segments 532, 534, and 536 include the dielectric liner, the connector trench segments 542, 544, and 546 also include the dielectric liner. A substrate pillar 550 is located in the trench intersection 540 and is laterally surrounded by the connector trench segments 542, 544, and 546. The substrate pillar 550 includes semiconductor material of the semiconductor substrate 502, accruing the advantage disclosed in reference to FIG. 2B. The substrate pillar 550 extends to bottoms of the connector trench segments 542, 544, and 546 and connects with the semiconductor material of the semiconductor substrate 502 under the trench intersection 540, similarly to the substrate pillar 450 of FIG. 4B.

The first connector trench segment 542 has a first connector segment width 560, measured across the first connector trench segment 542 to the substrate pillar 550. The first connector segment width 560 is at least as great as a minimum of the first linear segment width 552 and the second linear segment width 554, and is no greater than a maximum of the first linear segment width 552 and the second linear segment width 554. Thus, in this example, the first connector segment width 560 is at least as great as the second linear segment width 554 and is no greater than the first linear segment width 552.

The second connector trench segment 544 has a second connector segment width 562, measured across the second connector trench segment 544 to the substrate pillar 550. The second connector segment width 562 is at least as great as a minimum of the second linear segment width 554 and the third linear segment width 556, and is no greater than a maximum of the second linear segment width 554 and the third linear segment width 556. Thus, in this example, the second connector segment width 562 is at least as great as the second linear segment width 554 and is no greater than the third linear segment width 556.

The third connector trench segment 546 has a third connector segment width 564, measured across the third connector trench segment 546 to the substrate pillar 550. The third connector segment width 564 of this example is at least as great as a minimum of the first linear segment width 552 and the third linear segment width 556, and is no greater than a maximum of the first linear segment width 552 and the third linear segment width 556. Thus, in this example, in which the first linear segment width 552 and the third linear segment width 556 are equal, the third connector segment width 564 is equal to the first linear segment width 554 and equal to the third linear segment width 556. It is noted that a portion of the trench intersection 540 may form part of both the first and second connector trench segments 542 and 544, both the second and third connector trench segments 544 and 546, or both the third and first connector trench segments 546 and 542.

Having the first connector segment width 560, the second connector segment width 562, and the third connector segment width 564 with the ranges disclosed herein may accrue the advantages disclosed in reference to FIG. 2A and FIG. 2B. The substrate pillar 550 may have an area equal to 30 percent to 120 percent of a square with a side equal to a minimum of the first linear segment width 552, the second linear segment width 554, and the third linear segment width 556, further accruing the advantages disclosed in reference to FIG. 2A and FIG. 2B.

Various features of the examples disclosed herein may be combined in other manifestations of example microelectronic devices. For example, the deep trench structure 230 of FIG. 2A and FIG. 2B may be formed without the dielectric liner 218. Similarly, the deep trench structure 430 of FIG. 4A and FIG. 4B may be formed without the dielectric liner 418. The deep trench structure 230 of FIG. 2B may have openings at bottoms of the connector trench segments 244 and 248, as described in reference to FIG. 4B. Similarly, the deep trench structure 430 of FIG. 4B may have a continuous liner 418 that isolates the trench filler material 424 from the semiconductor substrate 402. Any of the connector trench segments 242, 244, 246, or 248 of FIG. 2A, any of the connector trench segments 342, 344, 346, or 348 of FIG. 3, or either of the connector trench segments 442, or 444 of FIG. 4, may have straight portions, as depicted in FIG. 5. Similarly, either of the connector trench segments 442, or 444 of FIG. 4, may follow arced paths, as depicted in FIG. 4A.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
a deep trench structure in a semiconductor substrate, the deep trench structure including:
a first linear trench having a first width;
a second linear trench having a second width;
a third linear trench having a third width;
a fourth linear trench having a fourth width;
a trench intersection, wherein the first, second, third and fourth linear trenches extend into the trench intersection, the trench intersection including:
a first connector trench connecting the first linear trench to the second linear trench;
a second connector trench connecting the second linear trench to the third linear trench;
a third connector trench connecting the third linear trench to the fourth linear trench; and
a fourth connector trench connecting the fourth linear trench to the first linear trench; and
a substrate pillar including a material of the semiconductor substrate, wherein:
the substrate pillar is laterally surrounded by the trench intersection;
the first connector trench follows a first arced path with a first inner radius that is 1.4 to 2.0 times a minimum of the first and second widths;
the second connector trench follows a second arced path with a second inner radius that is 1.4 to 2.0 times a minimum of the second and third widths;
the third connector trench follows a third arced path with a third inner radius that is 1.4 to 2.0 times a minimum of the third and fourth widths; and
the fourth connector trench follows a fourth arced path with a fourth inner radius that is 1.4 to 2.0 times a minimum of the fourth and first widths, such that the substrate pillar has an area equal to 30 percent to 120 percent of a square with a side equal to a minimum of the first, second, third, and fourth widths.

2. The semiconductor device of claim 1, wherein the substrate pillar abuts the first, second, third, and fourth connector trenches.

3. The semiconductor device of claim 1, wherein:
the first connector trench has a first connector width between a minimum of the first and second widths and a maximum of the first and second widths;
the second connector trench has a second connector width between a minimum of the second and third widths and a maximum of the second and third widths;
the third connector trench has a third connector width between a minimum of the third and fourth widths and a maximum of the third and fourth widths; and
the fourth connector trench has a fourth connector width between a minimum of the fourth and first widths and a maximum of the fourth and first widths.

4. The semiconductor device of claim 1, wherein:
the first linear trench is perpendicular to the second linear trench and to the fourth linear trench;
the first linear trench is parallel to, and aligned with, the third linear trench; and
the second linear trench is aligned with the fourth linear trench.

5. The semiconductor device of claim 1, wherein the first, second, third, and fourth widths are equal.

6. A method, comprising:
forming a deep trench in a semiconductor substrate having a top surface, the deep trench extending into the semiconductor substrate from the top surface; and
filling the deep trench with a trench filler material to form a deep trench structure, the deep trench structure including:
a first linear trench having a first width;
a second linear trench having a second width;
a third linear trench having a third width;
a fourth linear trench having a fourth width:
a first connector trench connecting the first linear trench to the second linear trench;
a second connector trench connecting the second linear trench to the third linear trench;

a third connector trench connecting the third linear trench to the fourth linear trench; and a fourth connector trench connecting the fourth linear trench to the first linear trench, wherein:

the first, second, third connector trenches laterally surround a substrate pillar that includes a material of the semiconductor substrate, the first connector trench follows a first arced path with a first inner radius that is 1.4 to 2.0 times a minimum of the first and second widths;

the second connector trench follows a second arced path with a second inner radius that is 1.4 to 2.0 times a minimum of the second and third widths;

the third connector trench follows a third arced path with a third inner radius that is 1.4 to 2.0 times a minimum of the third and fourth widths; and the fourth connector trench follows a fourth arced path with a fourth inner radius that is 1.4 to 2.0 times a minimum of the fourth and first widths, such that the substrate pillar has an area equal to 30 percent to 120 percent of a square with a side equal to a minimum of the first, second, third, and fourth widths.

7. The method of claim 6, wherein the substrate pillar abuts the first, second, third and fourth connector trenches.

8. The method of claim 6, further comprising:
forming a dielectric liner in the deep trench prior to filling the deep trench, the trench filler material being formed on the dielectric liner.

9. The method of claim 6, wherein filling the deep trench with the trench filler material to form the deep trench structure includes:

filling the deep trench with the trench filler material, wherein the trench filler material extends over the top surface of the semiconductor substrate; and removing the trench filler material from over the top surface of the semiconductor substrate.

10. The method of claim 9, wherein removing the trench filler material from over the top surface of the semiconductor substrate includes a chemical mechanical polish (CMP) process.

11. The method of claim 6, wherein the trench filler material includes polycrystalline silicon.

12. The semiconductor device of claim 1, wherein the deep trench structure includes a trench filler material on a dielectric liner disposed on an inner surface of a trench formed in the semiconductor substrate.

13. The semiconductor device of claim 12, wherein the dielectric liner includes an opening in a portion of a bottom of the trench such that the trench filler material directly touches the semiconductor substrate through the opening.

14. The semiconductor device of claim 1, wherein the deep trench structure includes a trench filler material disposed directly on an inner surface of a trench formed in the semiconductor substrate.

15. The semiconductor device of claim 1, wherein:
the first and third widths have a first dimension; and
the second and fourth widths have a second dimension different than the first dimension.

16. The method of claim 6, wherein:
the first connector trench has a first connector width between a minimum of the first and second widths and a maximum of the first and second widths;
the second connector trench has a second connector width between a minimum of the second and third widths and a maximum of the second and third widths;

the third connector trench has a third connector width between a minimum of the third and fourth widths and a maximum of the third and fourth widths; and the fourth connector trench has a fourth connector width between a minimum of the fourth and first widths and a maximum of the fourth and first widths.

17. A semiconductor device, comprising:
a deep trench structure in a semiconductor substrate, the deep trench structure including:
a first linear trench having a first width;
a second linear trench having a second width;
a third linear trench having a third width;
a fourth linear trench having a fourth width:
a trench intersection, wherein the first, second, third and fourth linear trenches extend into the trench intersection, the trench intersection including:
a first connector trench connecting the first linear trench to the second linear trench, wherein the distance across the first connector trench to a substrate pillar has a fifth width, wherein the fifth width is greater than the lesser of the first width and the second width;
a second connector trench connecting the second linear trench to the third linear trench, wherein the distance across the second connector trench to the substrate pillar has a sixth width, wherein the sixth width is greater than the lesser of the second width and the third width;
a third connector trench connecting the third linear trench to the fourth linear trench, wherein the distance across the first connector trench to the substrate pillar has a seventh width, wherein the seventh width is greater than the lesser of the third width and the fourth width; and
a fourth connector trench connecting the fourth linear trench to the first linear trench, wherein the distance across the first connector trench to the substrate pillar has an eighth width, wherein the eighth width is greater than the lesser of the fourth width and the first width; and
the substrate pillar including a material of the semiconductor substrate, wherein:
the substrate pillar is laterally surrounded by the trench intersection;
the first connector trench follows a first arced path with a first inner radius that is 1.4 to 2.0 times a minimum of the first and second widths;
the second connector trench follows a second arced path with a second inner radius that is 1.4 to 2.0 times a minimum of the second and third widths;
the third connector trench follows a third arced path with a third inner radius that is 1.4 to 2.0 times a minimum of the third and fourth widths; and
the fourth connector trench follows a fourth arced path with a fourth inner radius that is 1.4 to 2.0 times a minimum of the fourth and first widths, such that the substrate pillar has an area equal to 30 percent to 120 percent of a square with a side equal to a minimum of the first, second, third, and fourth widths.

18. The semiconductor device of claim 17, wherein:
wherein the fifth width is less than the greater of the first width and the second width;
wherein the sixth width is less than the greater of the second width and the third width;
wherein the seventh width is less than the greater of the third width and the fourth width; and wherein the eighth width is less than the greater of the fourth width and the first width.

19. The semiconductor device of claim 17, wherein the substrate pillar abuts the first, second, third, and fourth connector trenches.

20. The semiconductor device of claim 17, wherein the first, second, third, and fourth widths are different.

\* \* \* \* \*